United States Patent
Nogami et al.

[19]

[11] Patent Number: 6,106,680

[45] Date of Patent: Aug. 22, 2000

[54] APPARATUS FOR FORMING A COPPER INTERCONNECT

[75] Inventors: Takeshi Nogami; Axel Preusse, both of Sunnyvale, Calif.; Valery Dubin, Portland, Oreg.

[73] Assignee: AMD, Sunnyvale, Calif.

[21] Appl. No.: 09/237,573

[22] Filed: Jan. 26, 1999

[51] Int. Cl.[7] .................................................... C25B 11/00
[52] U.S. Cl. ........................ 204/280; 204/288; 204/289
[58] Field of Search .................................. 205/123, 125, 205/150, 151, 152, 157, 291, 292, 96; 204/280, 288, 289

[56] References Cited

U.S. PATENT DOCUMENTS 5,656,147  8/1997  Ishimoto et al. ............................ 205/96

*Primary Examiner*—Bruce F. Bell
*Attorney, Agent, or Firm*—Brinks Hofer Gilson & Lione

[57] ABSTRACT

A method and apparatus for fabricating electrochemical copper interconnections between the component parts of an integrated circuit on a semiconductor device. A cathodic platter is provided that includes contact pins that contact the surface of a semiconductor wafer at predetermined locations during the electrochemical deposition process. The contact pins are arranged on the cathodic platter so that when placed on the surface of the semiconductor wafer the contact pins surround the perimetrical edges of each respective semiconductor device on the semiconductor wafer. Once the semiconductor wafer is properly positioned on the cathodic platter, a copper conductive layer can be electrochemically and uniformly deposited on the surface of the semiconductor device.

10 Claims, 2 Drawing Sheets

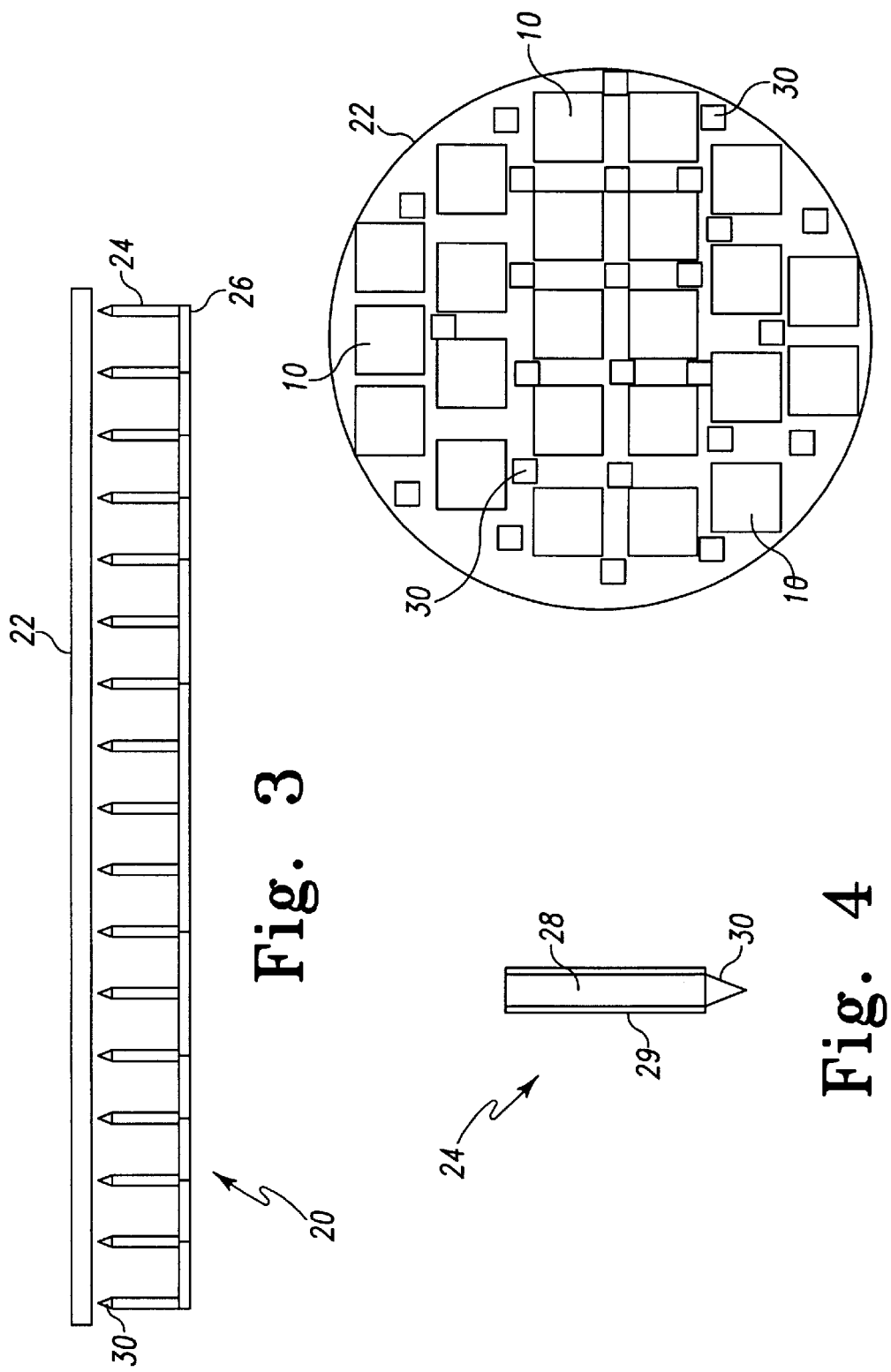

APPARATUS FOR FORMING A COPPER INTERCONNECT

FIELD OF THE INVENTION

The present invention relates generally to the metallization of layers in semiconductor devices, and in particular to methods of metallizing a copper conductive layer on the surface of a semiconductor wafer using electrochemical deposition.

BACKGROUND OF THE INVENTION

Metallization is the term used in the semiconductor industry to describe the process for surface wiring the component parts of an integrated circuit. In mediumscale integration only one-level is typically required during the metallization process. In these integrated circuits small contact holes are etched through the surface layers down to the silicon layer during contact masking. After contact masking, a thin metal layer is deposited into the contact holes by many commonly known methods such as vacuum evaporation, sputtering, physical vapor deposition ("PVD") or chemical vapor deposition ("CVD"). Aluminum or an aluminum silicon alloy was the primary metal used for the thin metal layer until the introduction of very-large-scale integration ("VLSI") technology and ultra-large-scale integration ("ULSI") technology. These VLSI and ULSI semiconductor chips require metal leads with better conductivity and smaller lead sizes capable of carrying large currents.

As known in the art, aluminum suffers from electromigration, which occurs when long skinny leads of aluminum carry high currents over long distances, as is the situation with VLSI and ULSI circuits. Electromigration occurs when the leads in the integrated circuits conduct large amounts of current and become heated, which in turn causes the aluminum that forms the lead to become mobile and diff-use causing a thinning of the lead. Electromigration can cause the chip to fail. Most of the time the chips fail in the field after installation as a result of electromigration. Aluminum—copper alloys have typically been used to try to overcome the problems associated with electromigration, but some electromigration still occurs. In addition, aluminum—copper alloys require complex deposition equipment and processes, cause an increased film resistivity and have different etch rates, thus adding to the complexity of the manufacturing process.

Another problem with using aluminum and aluminum alloys during the metallization process is that aluminum and silicon can dissolve into each other if the leads and silicon are heated to a certain temperature. In the semiconductor industry, this phenomenon is called eutectic formation. A eutectic formation occurs when two materials heated in contact with one another melt at temperatures much lower than their individual melting temperature. The problem with eutectic formations is that in shallow junctions, the alloy region can extend completely through the junction it fills causing it to short out. A method known in the art of preventing eutectic formations is applying a barrier layer between the silicon and the metal conductive layer that interconnects the component parts of the integrated circuit. Titanium-tungsten (TiW), Tantalum (Ta), and titanium nitride (TiN) are commonly used as barrier layers.

Copper metal has begun to replace aluminum and aluminum-silicon alloys in ULSI and VLSI metallization because it has better conductivity, a low RC constant and is more reliable than other metals used to interconnect the circuit component parts of an integrated circuit. The use of electrochemical deposition techniques for copper deposition is especially appealing because of low cost, high throughput, high quality of the deposited copper film and excellent via/trench filling capablities. Although aluminum has a resistance that can be tolerated by most integrated circuits, it is difficult to deposit in a high aspect ratio. Copper, however, is capable of being deposited with high aspect ratios. Also, copper is a better conductor than aluminum, provides good step coverage, is much more resistant to electromigration than aluminum or aluminum alloys, and can be deposited at low temperatures. However, copper will still diffuse into silicon if applied directly to the silicon without first applying a barrier layer.

One issue surrounding electrochemical deposition techniques is the fact that copper does not tend to adhere well to traditional barrier metals. Oxides tend to form on top of the barrier layer before the copper conductive layer can be deposited. In order to solve the problems associated with copper not adhering well to the barrier layer, a copper seed layer is normally deposited on top of the barrier layer. Deposition of the copper seed layer is often applied immediately after the barrier layer is deposited, without even breaking the vacuum used to apply the barrier layer. Because the vacuum remains intact, no oxides can form on the barrier layer before the copper seed layer is applied. Both the barrier layer and the copper seed layer may be deposited by conventional PVD or CVD techniques.

Another problem encountered when electrochemically depositing a metal, such as copper, on the surface of a semiconductor chip is keeping the deposited metal layer homogeneous. Prior methods of electrochemically depositing copper on the surface of a semiconductor device have used a cathodic platter that has a plurality of J-hook fingers, which holds the semiconductor wafer to be plated in place in the electrolytic plating solution. Due to the nature of their design, the J-hook fingers are capable of providing electrical contact to the very edge of the semiconductor wafer, which causes problems with the current density applied to the wafer during electrochemical deposition.

The lack of a uniform current density during electrochemical deposition causes the copper conductive layer deposited on the surface of the semiconductor wafer to be thicker towards the edges of the semiconductor wafer, which is where the J-hook fingers touch the semiconductor wafer, and thinner towards the middle of the semiconductor wafer. This results in higher plating rates around the J-hook fingers, which leads to the buildup of volcano shaped craters with the J-hook finger contact building the deepest point in the middle of the craters. A need exists for a method that allows a copper conductive layer to be directly applied to the semiconductor wafer, while providing a homogeneous deposition by maintaining constant current levels over the entire surface area of the semiconductor wafer during electrochemical deposition.

SUMMARY OF THE INVENTION

In view of the above, the present invention provides a method of depositing a copper conductive layer on the surface of a semiconductor wafer including the step of providing a semiconductor wafer having at least one semiconductor device prefabricated on the surface of the semiconductor wafer. The semiconductor device will already be prepared for the metallization process by having a plurality of integrated circuit components already fabricated on the surface of the semiconductor wafer. A cathodic platter is provided that includes a plurality of contact pins that are micro-positioned on a grid type array and held in place by a plurality of connection bars. The cathodic platter serves as the cathode during the electrochemical deposition process. In the disclosed method, the semiconductor wafer is micro-positioned so that the tips of the contact pins are positioned at predefined contact points on the semiconductor wafer containing the semiconductor device to be metallized. After the semiconductor wafer has been micro-positioned on the contact pins a copper conductive layer is electrochemically deposited on the surface of the semiconductor wafer by uniformly applying a current across the surface of the semiconductor wafer.

The electrochemical deposition step can be accomplished using one of two plating techniques. These plating techniques include electroplating and electroless plating, which are especially appealing because of low cost, high throughput, high quality of deposited copper film and excellent via/trench filling capability. Electroplating, in comparison to electroless plating, can provide higher deposition rates. In addition electroplating solutions contain copper ions that are more stable and easier to control than in the case of electroless plating. The present electrochemical deposition method is capable of filling sub-0.5 μm trenches. Electrochemical deposition should be construed to include both electroplating and electroless plating in the present invention.

The present invention overcomes the issues associated with the lack of a uniform current density over the surface area of the semiconductor wafer during electrochemical deposition. In addition, the present invention solves the problems associated with thick deposition of the copper conductive layer on the edge of the semiconductor wafer and thin deposition of the copper conductive layer towards the center of the semiconductor wafer during electrochemical deposition. Using the disclosed method and apparatus results in the deposition of a copper conductive layer that has a regular geometry, is highly conformal and uniformly distributed in the plane of the semiconductor wafer surface. Additionally, the deposited copper conductive layer exhibits the microstructural features of single crystals, which is preferred in the semiconductor industry.

The present invention provides a method of electrochemical deposition, using either electroplating or electroless plating, to deposit a copper conductive layer on the surface of an integrated circuit on a semiconductor wafer. The present invention provides a cathodic platter that is used during the electrochemical deposition process. Using the cathodic platter, the copper conductive layer can be deposited smoothly and evenly, exhibiting a microstructure having the characteristics of a single crystalline structure. Electroplating using the disclosed method and cathodic platter provides high aspect ratios (>4:1) and defect-free filling of 0.25 μm trenches. In addition, the resistivity of damascene electroplated copper lines has been measured to be about 2 $\mu\Omega$/cm These and other features and advantages of the invention will become apparent upon consideration of the following detailed description of the presently preferred embodiments of the invention, viewed in conjunction with the appended drawings.

BRIEF DESCRIPTION OF THE DRAWINGS

FIG. 3 is a side view of a semiconductor wafer that is micro-positioned on the contact pins of a cathodic platter.

FIG. 4 is a side view of a contact pins of a cathodic platter.

FIG. 5 depicts a semiconductor wafer with a plurality of semiconductor devices and further illustrates the points where the contact pins contact the surface of the semiconductor wafer.

DETAILED DESCRIPTION OF THE PRESENTLY PREFERRED EMBODIMENTS OF THE INVENTION

Figure 1:
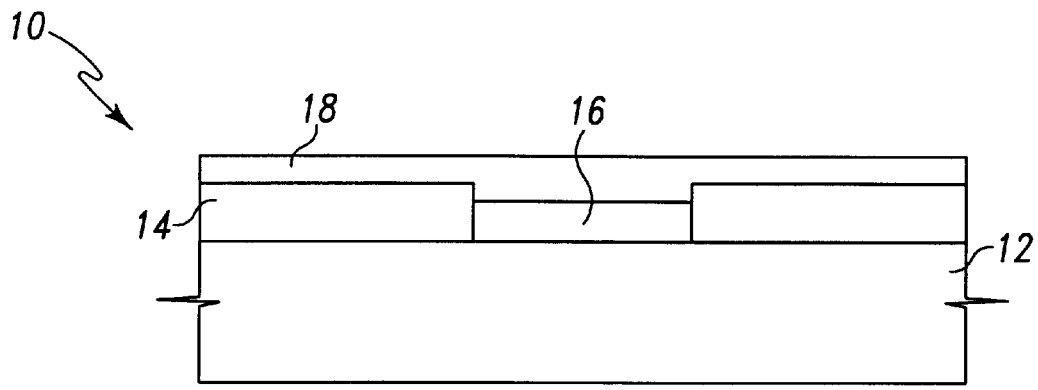
FIG. 1 is a cross-sectional view of a semiconductor device illustrating a silicon substrate having a dielectric layer, a contact opening, a barrier layer and a conductive copper layer.

FIG. 1 illustrates, in a cross section view, a semiconductor device 10 that includes a substrate layer 12, a dielectric layer 14, a barrier layer 16 and a conductive copper layer 18. Although not illustrated in FIG. 1, those skilled in the art would recognize that the integrated circuit that is patterned on the surface of the semiconductor device 10 likely contains thousands of individual electrical components that have been prefabricated on the substrate layer 12.

As with any electrical circuit, the electrical components that make up a integrated circuit need to be interconnected by a metal conductor in order to complete paths for current to travel through the integrated circuit. The electrically coupled components that make up the integrated circuit typically include transistors and various other logic components. For the purposes of the present invention, it should be noted that the components that make up the integrated circuit have already been prefabricated on the surface of the semiconductor device 10 using methods known in the art. However, a general description of how a semiconductor device 10 arrives at the metallization step is set forth below.

Typically, the dielectric layer 14 is deposited on the surface of the substrate layer 12 using various methods known in the art such as chemical vapor deposition ("CVD"), plasma enhanced chemical vapor deposition ("PECVD"), spin on depositing or thermal oxidation processes. The preferred material used for the dielectric layer 14 is silicon dioxide, or some variant of silicon dioxide. Dielectric layers 14 find use in semiconductor devices because they passify the surface of the substrate layer 14, act as doping barriers and serve as an integral dielectric part of the semiconductor device 10.

The barrier layer 16 is deposited between the substrate layer 14 and the copper conductive layer 10 using deposition methods known in the art. As previously noted, the barrier layer 14 is deposited on the semiconductor device 10 to prevent copper ions from diffusing with the substrate layer 12 during deposition of the copper conductive layer 18, which causes the component to short out and fail. The most common barrier materials used are tantalum, tantalum nitride, titanium, titanium nitride, and tungsten nitride. However, the preferred material used as the barrier layer 16 in the present invention is tungsten/tungsten nitride.

As known in the art of electrochemical deposition, in order to plate a precious metal on the surface of an object an electrolytic cell is used. Although not illustrated, the basic design of an electrolytic cell includes a cathode, an anode, a current source and an aqueous electrolyte. The aqueous electrolytic solution contains dissolved precious metals such as copper or gold. During electrochemical deposition the cathode, the anode and the semiconductor device 10 are immersed in the aqueous electrolytic solution. When the current source in the electrolytic cell provides current to the electrolytic solution, by providing a charge across the anode and the cathode, the metal ions contained in the aqueous electrolytic solution are deposited or plated on the surface of the piece to be plated.

As set forth above, when current is applied to the electrolytic solution the copper ions in the electrolytic solution accelerate. Once enough current is applied, the copper ions in the electrolytic solution accelerate to a sufficient velocity, which in turn causes the copper ions in the electrolytic solution to become plated or impregnated on the surface of the semiconductor device 10. The copper ions in the electrolytic solution are plated on the semiconductor device 10 through electric migration and diffusion. The amount of copper deposited over a period of time is controlled by the amount of current flowing in the electrolytic solution. As one skilled in the art would recognize, the present invention could be used in conjunction with most electrolytic cells used, or designed to be used, in the semiconductor industry.

Figure 2:
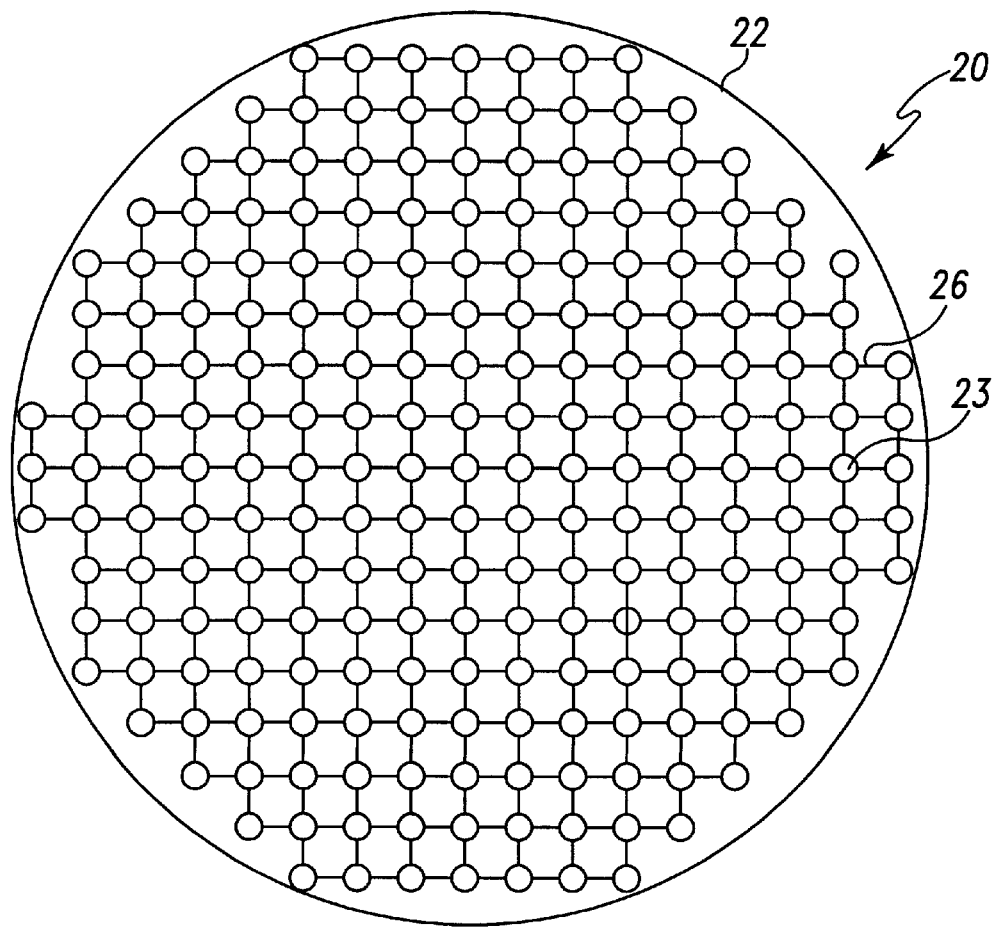
FIG. 2 is a bottom view of a semiconductor wafer that is micro-positioned on the contact pins of a cathodic platter.

FIGS. 2 and 3, illustrate a preferred embodiment of the cathodic platter 20 that used to electrochemically deposit a copper conductive layer 18 on respective semiconductor devices 10. Although not illustrated in FIGS. 2 and 3, the semiconductor devices 10 to be plated with the copper conductive layer 18 are located on the surface of a semiconductor wafer 22. The cathodic platter 20 includes an array of a plurality of micro-positioned contact pins 24 that are secured in place with a plurality of horizontal and vertical rows of connection bars 26, thereby creating a grid-type arrangement. The connection bars 26 may also be made from conductive wires. The contact pins 24 are specifically arranged on the cathodic platter 20 so that each respective contact pin 24 is associated with a predetermined location on the surface of the semiconductor wafer 22.

As illustrated best in FIG. 4, each respective contact pin 24 includes a shaft 28 and a tip 30. The contact pins 24 are made from a conductive material that is designed to withstand electrolytic solutions that are used during the electrochemical deposition process. The preferred material used to make the contact pins 24 is platinum. In addition, the shaft 28 of each respective contact pin 24 may be coated/sealed with a plastic coating 29 that is also designed to withstand the electrolytic solution used during electrochemical deposition. Each respective shaft 28 is coated/sealed to provide better current control at the surface of the semiconductor wafer 22 during the electrochemical deposition process.

As depicted best in FIGS. 3 and 5, during the electrochemical deposition process the surface of the semiconductor wafer 22 is micro-positioned on the tips 30 of the cathodic platter 20 at predetermined locations. Those skilled in the art would recognize that a plurality of individual semiconductor devices 10 are normally fabricated on the surface of the same semiconductor wafer 22. Therefore, in order to provide an even current distribution across the surface of the semiconductor wafer 22 during the electrochemical deposition process, the tips 30 of the contact pins 24 are specifically arranged to fit between respective semiconductor devices 10 on the semiconductor wafer 22. As such, the preferred arrangement of the contact pins 24 is designed so that the contact pins 24 surround each semiconductor device 10 on the surface of the semiconductor wafer 22.

Another embodiment of the present invention discloses a cathodic platter 20 for use in metallizing a copper conductive layer 18 on the surface of at least one semiconductor device 10 through electrochemical deposition. The cathodic platter 20 includes a plurality of wire links 26 that form a network. A plurality of nodes 23 are formed at predetermined intersection points of the wire links 26 with a plurality of contact pins 24. The contact pins 24 include a shaft 28 and a tip 30. Each respective tip 30 being used to contact the surface of the semiconductor wafer 22 containing the various semiconductor devices 10 to be metallized during by the electrochemical deposition process. The tips 30 of the contact pins 24 are preferably made from a conductive material, such as platinum, that is resistant to the electrolytic solution used during electrochemical deposition. The shaft 28 of each respective contact pin 24 may be covered/sealed with a plastic coating this is also designed to be resistant to the electrolytic solution used during the electrochemical deposition process step.

The present invention discloses a method of metallizing a copper conductive layer 18 on the surface of a semiconductor device 10. The method includes the step of providing a semiconductor wafer 22 that has at least one semiconductor device 10 including a plurality of prefabricated integrated circuit component parts that were prefabricated using methods known in the art. A cathodic platter 20 is provided that has a plurality of contact pins 24 that are micro-positioned at predetermined locations about the surface of the semiconductor wafer 22. Preferably, the grid type contact pins 24 are positioned to surround each semiconductor device 10 on the semiconductor wafer 22. The next step involves micro-positioning the semiconductor wafer 22 on the tips 30 of the contact pins 24. Then, a copper conductive layer 18 is electrochemically deposited on the surface of the semiconductor wafer 22, thereby electrically connecting the component parts of the integrated circuits that make up each respective semiconductor device 10.

As set forth above, the present invention discloses a cathodic platter and a method of electrochemically depositing a copper conductive layer on the surface of a semiconductor device. The present invention solves the problems associated with the prior art by providing a simpler method of electrochemically depositing a copper conductive layer on the surface of a semiconductor device. Using the disclosed method and cathodic platter the copper conductive layer can be deposited as a homogenous layer that exhibits the characteristics of single crystalline structures.

The disclosed cathodic platter is capable of providing a uniform current density to the surface of the semiconductor device during the plating process. Because the disclosed method of electrochemically depositing the copper conductive layer is so effective, a copper seed layer does not need to be deposited between the barrier layer and the copper conductive layer of the semiconductor device. In addition, the disclosed cathodic platter and method of metallizing using electrochemical deposition is effective in both electroplating and electroless plating.

While the invention has been described in its currently best known modes of operation and embodiments, other modes and embodiments of the invention will be apparent to those skilled in the art.

What is claimed is:

1. A cathodic platter for depositing a metal layer on at least one semiconductor device through electrochemical deposition, comprising:

a plurality of horizontal rows of connection bars;

a plurality of vertical rows of connection bars coupled to the plurality of horizontal rows of connection bars, said horizontal and vertical rows of connection bars being positioned to create a grid; and a plurality of conductive contact pins connected at predefined locations at intersections of the horizontal rows of connection bars and vertical rows of connection bars.

2. The cathodic platter of claim 1, wherein said plurality of conductive contact pins are precisely arranged on the cathodic platter so that when placed on the surface of the semiconductor wafer having at least one semiconductor device, said plurality of conductive contact pins surround the perimetrical edges of each semiconductor device on the semiconductor wafer.

3. The cathodic platter of claim 1, wherein each said conductive contact pin includes a shaft and a conductive tip which makes contact with the surface of the semiconductor wafer.

4. The cathodic platter of claim 3, wherein the conductive tip is made of platinum.

5. The cathodic platter of claim 3, wherein the shaft of each conductive contact pin is covered with a plastic coating that is capable of withstanding an electrolytic solution.

6. A cathodic platter for use in metallizing a conductive layer on at least one semiconductor device through electrochemical deposition, comprising:

a plurality of links forming a network;

a plurality of nodes formed at predetermined intersection points of said links; and a plurality of contact pins connected with each respective node.

7. The cathodic platter of claim 6, wherein said nodes are positioned.

8. The cathodic platter of claim 6, wherein said conductive contact pins include a shaft and a tip.

9. The cathodic platter of claim 8, wherein the tip is made of a conductive material.

10. The cathodic platter of claim 8, wherein the shaft is coated with a plastic material resistant to electrolytic solutions.

* * * * *